(12) United States Patent
Gaume et al.

(10) Patent No.: US 11,784,268 B2
(45) Date of Patent: Oct. 10, 2023

(54) FLEXIBLE AND LIGHT PHOTOVOLTAIC MODULE

(71) Applicants: COMMISSARIAT A L'ENERGIE ATOMIQUE ET AUX ENERGIES ALTERNATIVES, Paris (FR); THALES, Courbevoie (FR); CONCEPT COMPOSITES AUVERGNE—2CA, Arlanc (FR)

(72) Inventors: Julien Gaume, Grenoble (FR); Rodolphe Chaix, Cannes la Bocca (FR); Jean-Baptiste Billard, Cannes la Bocca (FR); Thomas Guerin, Grenoble (FR); Pierre Ruols, Porte de Savoie (FR)

(73) Assignees: Commissariat a l'Energie Atomique et aux Energies Alternatives, Paris (FR); Thales, Courbevoie (FR); Concept Composites Auvergne 2CA, Arlanc (FR)

( * ) Notice: Subject to any disclaimer, the term of this patent is extended or adjusted under 35 U.S.C. 154(b) by 1 day.

(21) Appl. No.: 17/531,548

(22) Filed: Nov. 19, 2021

(65) Prior Publication Data
US 2022/0165898 A1 May 26, 2022

(30) Foreign Application Priority Data
Nov. 23, 2020 (FR) ....................... 2012016

(51) Int. Cl.
*H01L 31/048* (2014.01)
*H01L 31/18* (2006.01)

(52) U.S. Cl.
CPC ...... *H01L 31/0481* (2013.01); *H01L 31/1864* (2013.01)

(58) Field of Classification Search
CPC . H01L 31/042; H01L 31/048; H01L 31/0481; H01L 31/049; H01L 31/18; H01L 31/1864
See application file for complete search history.

(56) References Cited

U.S. PATENT DOCUMENTS

| 9,004,410 B1 | 4/2015 | Steele et al. |
| 2016/0254404 A1* | 9/2016 | Dries ............... H01L 31/048 136/251 |

(Continued)

FOREIGN PATENT DOCUMENTS

| CN | 203 367 314 U | 12/2013 |
| EP | 2 450 967 A1 | 5/2012 |

(Continued)

*Primary Examiner* — Mayla Gonzalez Ramos
(74) *Attorney, Agent, or Firm* — BakerHostetler (57) ABSTRACT

A photovoltaic module includes a transparent first layer forming the front side of the photovoltaic module; a plurality of photovoltaic cells placed side-by-side and electrically connected; a polymer encapsulating assembly able to encapsulate the plurality of photovoltaic cells between a lower portion and an upper portion; a second layer made of a composite material based on polymer resin and on fibres, the encapsulating assembly and the photovoltaic cells being located between the first and second layers, at least the first and second layers defining edges of the photovoltaic module, the plurality of photovoltaic cells being spaced apart by a non-zero distance $D_A$ from at least one edge of the photovoltaic module; the photovoltaic module further comprises a third layer made of a composite material based on polymer resin and on fibres, the layer being located below the plurality of photovoltaic cells and above the lower portion of the encapsulating assembly and forming at least one peripheral strip extending from the at least one edge toward the centre of the module, the width ($L_{15A}$) of which is larger than or equal to the distance $D_A$.

18 Claims, 4 Drawing Sheets

(56) References Cited

U.S. PATENT DOCUMENTS

2019/0312164 A1* 10/2019 Sugiyama ............. H01L 31/048
2021/0249549 A1*  8/2021 Gaume ................... C08J 5/244

FOREIGN PATENT DOCUMENTS

| JP | 2002-141542 A | 5/2002 | | |
|---|---|---|---|---|
| RU | 178 429 U1 | 4/2018 | | |
| WO | 2019/224458 A1 | 11/2019 | | |
| WO | WO-2019224458 A1 * | 11/2019 | ............... | B32B 7/12 |

* cited by examiner

FLEXIBLE AND LIGHT PHOTOVOLTAIC MODULE

CROSS-REFERENCE TO RELATED APPLICATIONS

This application claims priority to foreign French patent application No. FR 2012016, filed on Nov. 23, 2020, the disclosure of which is incorporated by reference in its entirety.

FIELD OF THE INVENTION

The present invention relates to the field of photovoltaic modules comprising a set of photovoltaic cells that are electrically connected to one another, and preferably so-called "crystalline" photovoltaic cells, i.e. photovoltaic cells that are based on single-crystal or multicrystalline silicon.

More precisely, the present invention relates to the field of photovoltaic modules that are ultra-light (weight per unit area lower than 1 kg/m$^2$ or even lower than 800 g/m$^2$, or indeed even lower than 600 g/m$^2$) and flexible.

BACKGROUND

The invention may be applied to many applications, to autonomous and/or on-board applications for example, and is particularly applicable to applications that require use of flexible (no glass) photovoltaic modules that are ultralight, and that in particular have a weight per unit area lower than 1 kg/m$^2$, and especially lower than 800 g/m$^2$, or indeed even lower than 600 g/m$^2$, and that are of small thickness, in particular smaller 1 mm. It may thus in particular be applied: to buildings such as dwellings or business premises (industrial sites, office blocks, commercial premises, etc.), for example to produce the roofs thereof; to the design of urban furniture, for example to provide lighting of public spaces; to road signs; or even to recharging of electric cars; or indeed also be used in portable applications and in particular integrated into flying objects, cars, buses or boats, inter alia.

A photovoltaic module is an assembly of photovoltaic cells that are placed side-by-side between a first layer forming a front side of the photovoltaic module and a second layer forming a back side of the photovoltaic module. The first layer forming the front side of the photovoltaic module is transparent in order to allow the photovoltaic cells to receive a light flux.

The photovoltaic cells may be electrically connected to one another by front and back electrical contact elements, which are called interconnects, and which are for example formed by tin-coated copper lines that are placed against the front sides (sides located facing the front side of the photovoltaic module, i.e. the side intended to receive a light flux) and back sides (sides located facing the back side of the photovoltaic module) of each of the photovoltaic cells, respectively, or indeed even solely on the back side as regards IBC photovoltaic cells (IBC being the acronym of interdigitated back contact).

Moreover, the photovoltaic cells located between the first and second layers forming the front and back sides of the photovoltaic module, respectively, may be encapsulated.

Figure 1:
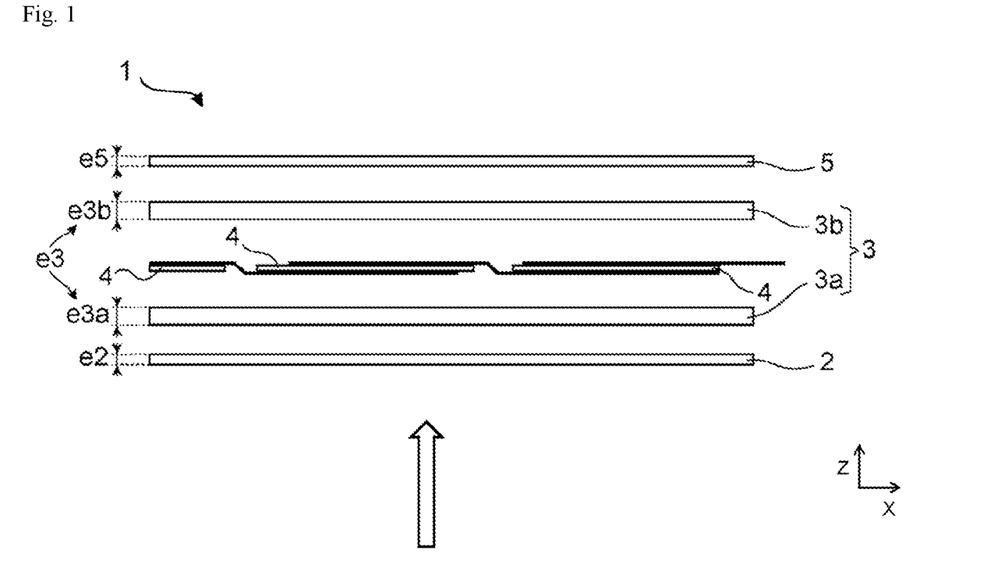
FIG. 1 shows one photovoltaic module of the prior art.

Patent application WO2019224458A1 describes an ultra-light photovoltaic module, which is shown in FIG. 1. The photovoltaic module 1 comprises:
- a transparent first layer 2 forming the front side of the photovoltaic module and comprising at least one polymer with a thickness e2 smaller than 50 μm;
- the second layer 5, which may form the back side of the photovoltaic module, and which comprises at least one pre-preg composite material based on polymer resin and on fibres, and which has a weight per unit area lower than 150 g/m$^2$;
- a plurality of photovoltaic cells 4 placed side-by-side and electrically connected to one another by electrical contact elements taking the form of interconnecting lines,
- an assembly 3 (formed by two layers 3a and 3b) that encapsulates the plurality of photovoltaic cells and that has a maximum thickness e3 smaller than 150 μm; the encapsulating assembly and the plurality of photovoltaic cells being located between the first and second layers.

The arrow corresponds to the light radiation, which arrives via the transparent first layer 2, which forms the front side of the photovoltaic module.

The photovoltaic module 1 is produced in a single step of hot lamination, at a temperature comprised between 130° C. and 170° C., the lamination cycle lasting at least 10 minutes, of the constituent layers 2, 3, 4, 5 from which the photovoltaic module 1 is made.

Figure 2:
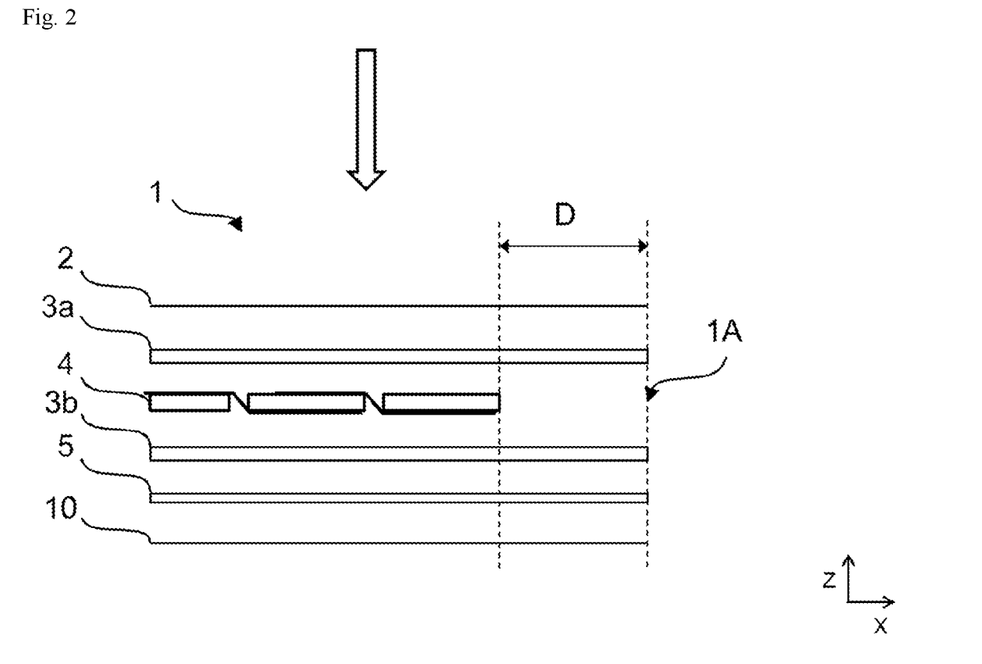
FIG. 2 shows one particular photovoltaic module of the prior art.

As illustrated in FIG. 2, in practice, the first and second layers and the assembly encapsulating the photovoltaic cells have a prominence D with respect to the photovoltaic cells on at least one edge 1A of such a photovoltaic module 1.

In other words, the photovoltaic cells are distant from the module edges formed by the first and second layers and by the assembly encapsulating the photovoltaic cells (distance equal to the value of the prominence D). This allows said cells to be better protected. In this figure the photovoltaic module further comprises, on the back side, an additional layer 10 made of the same material as that from which the first layer 2 forming the front side of the photovoltaic module 1 is made.

FIG. 2 shows a single edge, but a prominence generally exists on all the edges of the module and it is generally of the same width on all the edges.

The encapsulating assembly must generally have a prominence of at least 16 mm (from the edge of the last electrical conductor, cell or interconnecting line) or more, in order to ensure electrical insulation when the lamination operation has been carried out, if the module is subjected to an operating voltage of 1000 V. This prominence also allows the impermeability of the module to water and chemicals to be ensured. The first and second layers follow the dimensions of the encapsulating assembly. This prominence may be smaller if the materials used have very high dielectric constants, if the operating voltage of the module is lower or indeed if the environmental conditions of use of the module do not require a high impermeability to water or chemicals. In any case, for reasons of ease of processing, the prominence is very often at least 5 mm.

Furthermore, certain applications of such ultralight photovoltaic modules (for example integration into a flying object) often require them to be fastened to an object by fastening means located on the edges of the module, and not via their back side as may be the case with other photovoltaic modules and/or other applications.

However, the inventors have observed that, with an ultra-light photovoltaic module such as described above, after lamination, internal stresses related to the asymmetry of the obtained structure lead to a curvature on the edges of the module. These curvatures may then complicate, hinder or even prevent use of the aforementioned fastening means. The curvatures may furthermore generate a risk of snaring or cause problems by getting caught in the wind, or even generate aesthetic defects that are incompatible with certain applications.

SUMMARY OF THE INVENTION

The invention aims to overcome the aforementioned drawbacks of the prior art.

More particularly, the invention aims to provide a flexible and ultralight photovoltaic module the edges of which have little or no curvature, while nonetheless having mechanical properties and an electrical performance that are at least equivalent to those of prior-art flexible and ultralight photovoltaic modules. In other words, the invention aims to obtain flexible and ultralight photovoltaic modules that are as flat as possible.

A first subject of the invention allowing these drawbacks to be remedied is a photovoltaic module comprising:

- a transparent first layer forming the front side of the photovoltaic module, which side is intended to receive a light flux,
- a plurality of photovoltaic cells placed side-by-side and electrically connected to one another,
- an encapsulating assembly able to encapsulate the plurality of photovoltaic cells, and comprising a lower portion and an upper portion, the encapsulating assembly preferably being made of polymer,
- a second layer comprising at least one composite material based on polymer resin and on fibres, the encapsulating assembly and the plurality of photovoltaic cells being located between the first and second layers,
at least the first layer and the second layer defining the edges of the photovoltaic module; characterized in that the plurality of photovoltaic cells is spaced apart by a non-zero distance $D_A$ from at least one edge of the photovoltaic module, and in that the photovoltaic module further comprises a third layer, or strengthening layer, located below the plurality of photovoltaic cells and above the lower portion of the encapsulating assembly, said third layer forming at least one peripheral strip extending from the at least one edge toward the centre of said module and the width of which is larger than or equal to the distance $D_A$, said third layer comprising at least one composite material based on polymer resin and on fibres.

Preferably, the difference between the width of the at least one peripheral strip and the distance $D_A$ between the plurality of photovoltaic cells and the at least one edge is smaller than or equal to 30 mm, and more preferably smaller than or equal to 20 mm.

Preferably, the width of the at least one peripheral strip of the third layer is strictly larger than the at least one distance between the photovoltaic cells and the at least one edge.

Preferably, the second layer is made of a pre-preg material based on polymer resin and on fibres.

Preferably, the third layer is made of a pre-preg material based on polymer resin and on fibres.

By "strip", what must be understood is an element extending longitudinally in the direction of the edge and the width of which is defined perpendicular to the direction of the edge in the plane of the photovoltaic module.

A strip is said to be "peripheral" in that it is arranged on an edge of the photovoltaic module. Thus, a peripheral strip is arranged from one edge of the photovoltaic module and reaches, or even projects under, the (or the more than one) photovoltaic cell(s) closest the edge.

The "distance" between an edge and the plurality of photovoltaic cells implies the shortest distance between said edge and the one or more photovoltaic cells closest to the edge.

The distances between all the edges of the photovoltaic module and the plurality of photovoltaic cells may all be identical. In this case, the peripheral-strip widths may also all be identical.

The thicknesses of the cells and of the various layers, and in particular of the peripheral strips, are defined in the direction perpendicular to the plane of the photovoltaic module.

The term "transparent" means that the material of the first layer forming the front side of the photovoltaic module is at least partially transparent to visible light, letting at least around 80% of this light pass.

The "front side" of the photovoltaic module corresponds to the side intended to receive a light flux. It may be designated the "top side". The "back side" corresponds to the opposite side of said module. It may be designated the "bottom side". The terms "below" and "bottom" or "lower" are to be understood with reference to the back side of the photovoltaic module. In contrast, the terms "above" and "top" or "upper" are to be understood with reference to the front side of the photovoltaic module.

Furthermore, by the term "encapsulating" or "encapsulated", what must be understood is that the plurality of photovoltaic cells is placed in a volume, which is for example hermetically seal-tight with respect to liquids, and which is at least partially formed by at least two layers of encapsulating material(s) that are joined to each other after lamination to form the encapsulating assembly.

Specifically, initially, i.e. before any lamination operation, the encapsulating assembly is made up of at least two layers of encapsulating material(s), which are referred to as core layers, between which the plurality of photovoltaic cells is encapsulated. However, during the operation of lamination of the layers, the layers of encapsulating material melt to form, after the lamination operation, only a single solidified layer (or assembly) in which the photovoltaic cells are embedded.

Thus, the invention aims to improve the symmetry of the materials in the regions without photovoltaic cells and optionally without interconnecting lines, by adding one or more peripheral strips (strengthening layer) solely to these regions and/or by modifying other constituent layers of the module. This makes it possible to avoid creating curvatures on the edges of the photovoltaic module.

These peripheral strips may be made from materials from which layers already present in the photovoltaic module are made, such as the composite material based on polymer resin and on fibres of the second layer. The aim of these peripheral strips located on the edges is to increase the symmetry of the structure of the photovoltaic module on its edges, and better still to improve symmetry full stop, while meeting all the other constraints, which depend on the targeted application of the photovoltaic module.

One obvious solution would have been, starting with the photovoltaic module of FIG. 2, to place another layer made of the pre-preg composite material based on polymer resin and on fibres (by way of second layer) between the transparent first layer and the upper encapsulating layer, in order to make the various layers symmetric. The invention differs from such a solution in that a third layer or strengthening layer is placed between the plurality of photovoltaic cells and the lower portion of the encapsulating assembly and in that said third layer takes the form of a peripheral strip (or peripheral frame if all the edges are provided with a strip of the third layer). This makes it possible to protect the third layer from light rays (it remains below the cells) and prevents a decrease in performance (before reaching the cells, the rays do not have to pass through an additional layer). The process for manufacturing the module according to the invention is as simple as that of the prior-art ultralight photovoltaic module. Furthermore, positioning a single strip on the edges rather than providing a whole layer allows material to be saved, which may be very advantageous if the photovoltaic modules are large in size. Lastly, this avoids adding too much weight to the photovoltaic module.

These peripheral strips thus allow an ultralight and flat (no curvature) photovoltaic module to be formed, this facilitating the use of a system for fastening the photovoltaic module without considerably increasing the weight per unit area and the cost price of such a module.

The photovoltaic module according to the invention may furthermore comprise one or more of the following features, alone or in any technically possible combination. In other words, the embodiments indicated below may be combined together, unless it is explicitly a question of one embodiment that is an alternative to another.

According to one embodiment, the third layer and/or the second layer are/is made of a composite material based on polymer and on fibres, the polymer preferably being chosen from polyester, epoxy and/or acrylic; and/or the fibres preferably being chosen from glass fibres, carbon fibres and/or aramid fibres.

According to one preferred embodiment, the third layer is made of the same composite material as the second layer.

According to one particular embodiment, the third layer forms a plurality of peripheral strips, and preferably at least two opposite strips, and even more preferably four strips, each peripheral strip extending from one edge of the photovoltaic module toward the centre of said module, the width of each peripheral strip being larger than or equal to the distance $D_A$, $D_B$, $D_C$, $D_D$ between said edge and the plurality of photovoltaic cells. Preferably, the difference between the width of each peripheral strip and the distance $D_A$, $D_B$, $D_C$, $D_D$ is smaller than or equal to 30 mm, and even more preferably smaller than or equal to 20 mm.

Preferably, the width of each peripheral strip of the third layer is strictly larger than the distance $D_A$, $D_B$, $D_C$, $D_D$.

According to one embodiment, the encapsulating assembly extends up to the edges of the photovoltaic module.

According to one alternative embodiment to the preceding embodiment, the upper portion of the encapsulating assembly is spaced apart by a distance $D_{3A}$ from the at least one edge of the photovoltaic module, the distance $D_{3A}$ being non-zero and smaller than the distance $D_A$ between said at least one edge and the plurality of photovoltaic cells, the difference between said distances $D_A$ and $D_{3A}$ preferably being smaller than or equal to 10 mm. In particular, the upper portion of the encapsulating assembly may be spaced apart by a non-zero distance $D_{3A}$, $D_{3B}$, $D_{3C}$, $D_{3D}$ from each edge of the photovoltaic module, the difference between the distance $D_{3A}$, $D_{3B}$, $D_{3C}$, $D_{3D}$ and the distance $D_A$, $D_B$, $D_C$, $D_D$ between said edge and the plurality of photovoltaic cells preferably being smaller than or equal to 10 mm.

According to one embodiment, the photovoltaic module further comprises a fifth layer, which is preferably made of polymer, located below the second layer, said fifth layer forming at least one peripheral strip extending from the at least one edge toward the centre of said module and the width of which is larger than or equal to the distance $D_A$ between said at least one edge and the plurality of photovoltaic cells. Preferably, the difference between said width and said distance is smaller than or equal to 30 mm, and even more preferably smaller than or equal to 20 mm.

According to one particular embodiment, the fifth layer forms a plurality of peripheral strips, and preferably at least two opposite strips, and even more preferably four strips, each peripheral strip extending from one edge of the photovoltaic module toward the centre of said module and the width of each peripheral strip being larger than or equal to the distance $D_A$, $D_B$, $D_C$, $D_D$ between said edge and the plurality of photovoltaic cells. Preferably, the difference between the width of each peripheral strip and the distance $D_A$, $D_B$, $D_C$, $D_D$ is smaller than or equal to 30 mm, and even more preferably smaller than or equal to 20 mm.

Preferably, the width of each peripheral strip of the fifth layer is strictly larger than the distance $D_A$, $D_B$, $D_C$, $D_D$.

Said fifth layer is preferably made of the same polymer as the material of the encapsulating assembly, or at least of a polymer having the same thermomechanical properties.

According to one particular embodiment, the dimensions of the fifth layer are substantially equal to the dimensions of the third layer.

According to one embodiment, the photovoltaic module further comprises: a fourth layer forming the back side of the photovoltaic module, the second layer being located between the encapsulating assembly and said fourth layer, said fourth layer being made of the same material as the material from which the first layer is made, and having a thickness smaller than or equal to that of the first layer.

The photovoltaic module may furthermore have the following additional features, alone or in combination with one another, and with one or more of the preceding features:
the first layer is made of a polymer;
the first layer has a thickness smaller than or equal to 50 µm;
the encapsulating assembly has a maximum thickness smaller than 150 µm;
the second layer has a weight per unit area lower than 150 g/m$^2$;
the encapsulating assembly comprises an upper encapsulating layer placed between the first layer and the plurality of photovoltaic cells and a lower encapsulating layer placed between the plurality of photovoltaic cells and the second layer.

A second subject of the invention is a process for producing such a photovoltaic module comprising at least a step of hot lamination, at a temperature comprised between 130° C. and 170° C., and in particular of the order of 150° C., the lamination cycle lasting at least 10 minutes, and in particular between 10 and 20 minutes, of the layers from which the photovoltaic module is made.

The photovoltaic module and the production process according to the invention may comprise any one of the features mentioned above, alone or in any technically possible combination with other features.

BRIEF DESCRIPTION OF THE DRAWINGS

Other features and advantages of the invention will become apparent on reading the following description, which is given by way of illustration and non-limiting, with reference to the appended figures, in which.

In all these figures, identical references may designate elements that are identical or analogous.

In addition, the various parts shown in the figures are not necessarily shown to scale, the sake of legibility of the figures.

DETAILED DESCRIPTION

FIGS. 1 and 2 have already been described in the section regarding the prior art.

In all the figures in cross section, the arrow corresponds to the light radiation.

It will be noted that FIGS. 3, 5, 6 and 7 correspond to exploded XZ sections of three photovoltaic-module embodiments and of one photovoltaic-module variant before the lamination step of the manufacturing process according to the invention. Once the lamination step has been carried out, i.e. hot pressing under vacuum has been carried out, the various layers are in fact superposed on one another in a main XY plane.

Figure 4:
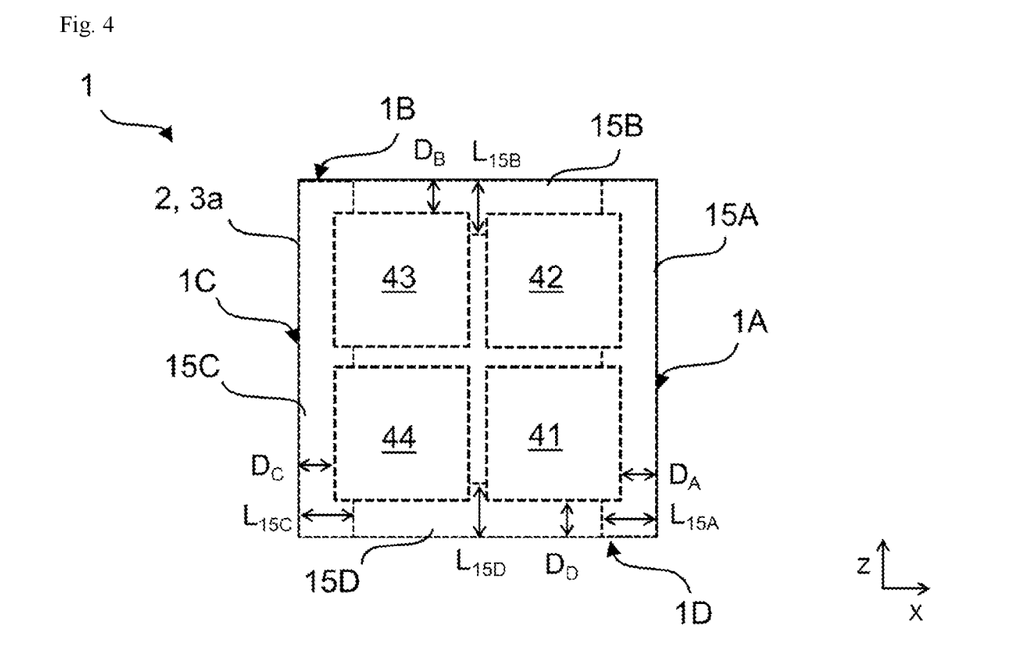
FIG. 4 illustrates, seen from above, one particular example of realization of the first embodiment of a photovoltaic module according to the invention.

FIG. 4 corresponds to an XY view from above of one particular example of realization of the first embodiment.

Figure 8:
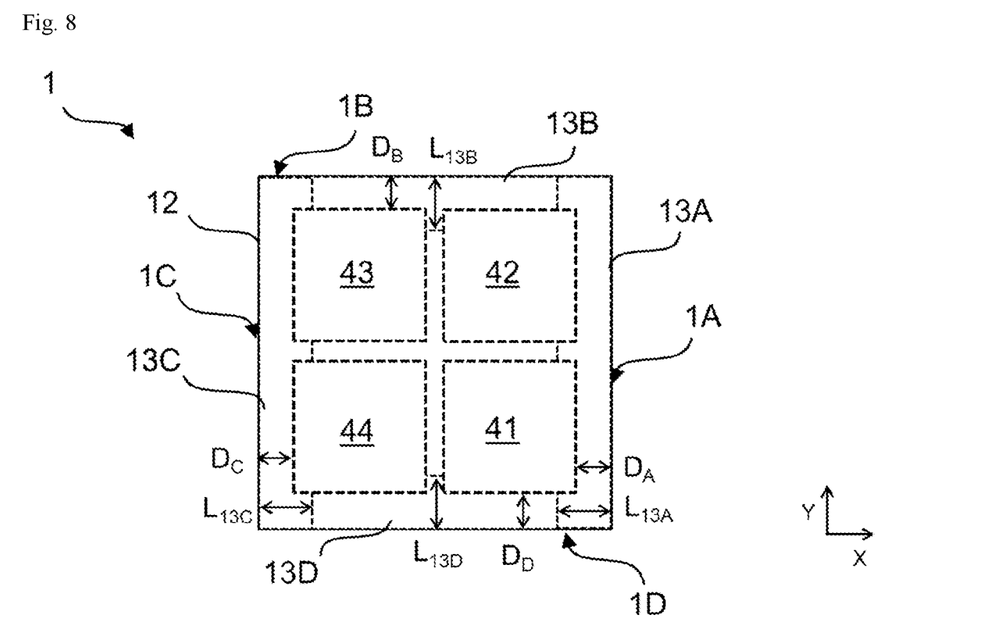
FIG. 8 illustrates, seen from above, one particular example of realization of the third embodiment of a photovoltaic module according to the invention.

FIG. 8 corresponds to an XY view from above of one particular example of realization of the third embodiment.

In all of FIGS. 3 to 8, and more generally in the context of the invention, the photovoltaic module may comprise one or more of the following features.

Preferably, the first layer 2, and the fourth layer 12 where appropriate, comprise at least one polymer.

The polymer of the first layer 2 (and of the fourth layer 12 where appropriate) may be chosen from: polycarbonate (PC), polymethyl methacrylate (PMMA), polyethylene terephthalate (PET), polyamide (PA), a fluoropolymer, in particular polyvinyl fluoride (PVF) or polyvinylidene fluoride (PVDF), ethylene tetrafluoroethylene (ETFE), ethylene chlorotrifluoroethylene (ECTFE), polytetrafluoroethylene (PTFE), polychlorotrifluoroethylene (PCTFE) and/or fluorinated ethylene propylene (FEP).

The first layer 2 (and the fourth layer 12 where appropriate) have a thickness smaller than 50 μm, and advantageously comprised between 5 μm and 25 μm.

The encapsulating assembly 3 (and the fifth layer 13 where appropriate) may be made from at least one polymer chosen from: acid copolymers; ionomers; poly(ethylene vinyl acetates) (EVA); vinyl acetals such as polyvinyl butyrals (PVB); polyurethanes; poly(vinyl chlorides); polyethylenes such as linear low-density polyethylenes; polyolefin copolymer elastomers; copolymers of α-olefins and of α,β-ethylenically unsaturated carboxylic acid esters, such as ethylene methyl acrylate copolymers and ethylene butyl acrylate copolymers; silicone elastomers; and/or epoxy resins.

The encapsulating assembly 3 has a total thickness e3 that is smaller than or equal to 150 μm, and preferably comprised between 20 and 100 μm, and more preferably comprised between 50 μm and 75 μm.

The encapsulating assembly 3 may in particular be produced from two polymer layers 3a (upper encapsulating layer) and 3b (lower encapsulating layer). It may be a question of two layers of poly(ethylene-vinyl acetate) (EVA) or two layers of ionomer, between which layers are placed the photovoltaic cells 4. Each layer 3a, 3b may have a thickness e3a, e3b lower than or equal to 75 μm, and preferably lower than or equal to 50 μm. These layers 3a and 3b, although preferably of identical nature, may have different optical properties.

The photovoltaic cells 4 may be chosen from: homojunction or heterojunction photovoltaic cells based on single-crystal silicon (c-Si) and/or multicrystalline silicon (mc-Si), and/or IBC photovoltaic cells, and/or photovoltaic cells comprising at least one material among amorphous silicon (a-Si), microcrystalline silicon (μC-Si), cadmium telluride (CdTe), copper indium selenide (CIS) and copper indium/gallium diselenide (CIGS) or indeed multi junction (III/V) cells. Their thickness is comprised between 1 and 300 μm, and in particular between 1 and 200 μm.

The photovoltaic cells 4 may have a thickness e4 comprised between 1 and 300 μm, and in particular between 1 and 250 μm, or even between 1 and 200 μm, and advantageously between 70 μm and 150 μm.

Furthermore, the spacing between two neighbouring, or even consecutive or adjacent, photovoltaic cells may be larger than or equal to 0.5 mm, and in particular comprised between 1 and 30 mm, and preferably equal to 2 mm.

Furthermore, the photovoltaic cells 4 may be interconnected by lines made of soldered tin-coated copper. The thickness of the lines interconnecting the photovoltaic cells is tailored to be compatible with the lamination process and the small thickness of the encapsulating assembly. The lines interconnecting the cells may have a thickness smaller than 100 μm and a width smaller than 3 mm.

The second layer 5 comprises a pre-preg composite material based on polymer resin and on fibres having a weight per unit area lower than 150 g/m$^2$, and advantageously comprised between 50 g/m$^2$ and 115 g/m$^2$. It may for example be made of said at least one composite material. The woven fabric of the pre-preg may have a weight per unit area lower than or equal to 50 g/m$^2$, and the degree of impregnation with polymer resin may be comprised between 30 and 70 wt %.

The composite material of the second layer 5 may be a pre-preg based on polymer resin and on fibres, the polymer being chosen from polyester, epoxy and/or acrylic, and the fibres being chosen from glass fibres, carbon fibres and/or aramid fibres.

The second layer 5 may in particular have a thickness e5 smaller than or equal to 100 μm, and in particular comprised between 50 μm and 80 μm.

In the shown embodiments, the third layer 15 (or strengthening layer) is also made of a pre-preg composite material based on polymer resin and on fibres. This may be one of the materials listed above, with reference to the second layer 5.

In one preferred embodiment, the third layer 15 is made of the same material as the second layer 5.

The third layer 15 may in particular have a weight per unit area comprised between 50 g/m$^2$ and 150 g/m$^2$. The third layer may in particular have a thickness e15 smaller than or equal to 100 µm, and in particular comprised between 50 µm and 80 µm.

It will be noted that the first layer and/or the second layer of the photovoltaic module may be formed from one or more portions, i.e. they may be monolayers or multilayers.

Figure 3:
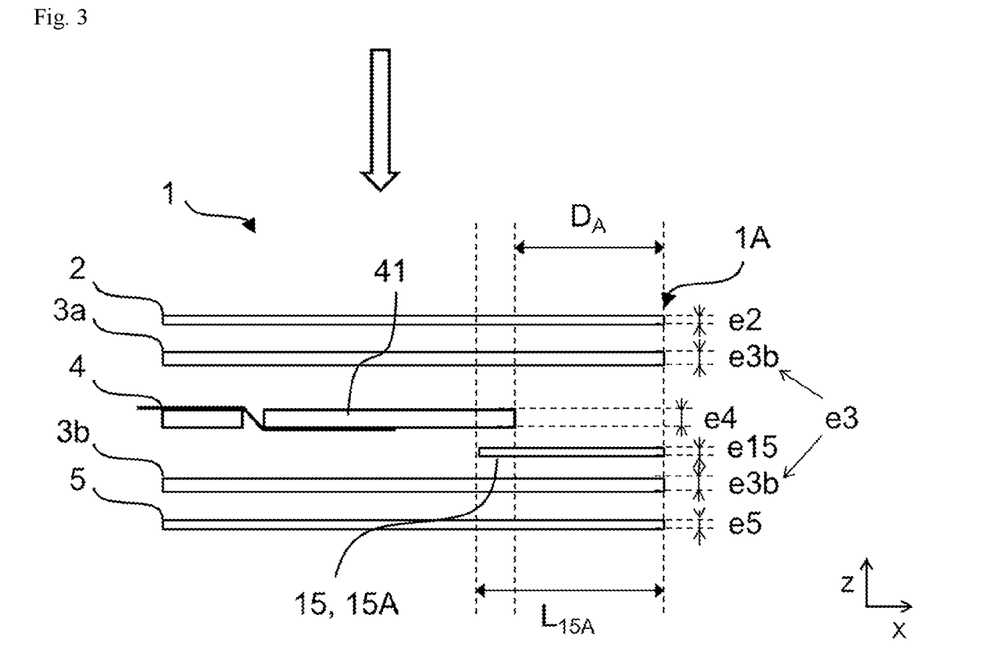
FIG. 3 illustrates, in cross section and exploded, a first embodiment of a photovoltaic module according to the invention.

FIG. 3 illustrates, in cross section and exploded, a first embodiment of a photovoltaic module 1 comprising:
- a transparent first layer 2 forming the front side of the photovoltaic module, which side is intended to receive a light flux,
- a plurality of photovoltaic cells 4 placed side-by-side and electrically connected to one another,
- an encapsulating assembly 3 comprising an upper encapsulating layer 3a placed above the plurality of photovoltaic cells 4 and a lower encapsulating layer 3b placed below the plurality of photovoltaic cells 4, the assembly being able to encapsulate the plurality of photovoltaic cells,
- a second layer 5 comprising at least one pre-preg composite material based on polymer resin and on fibres, the encapsulating assembly 3 and the plurality of photovoltaic cells 4 being located between the first and second layers.

The first layer 2 and the second layer 5 define the edges of the photovoltaic module 1, as does the encapsulating assembly, which extends up to the edges of the module.

Furthermore, the plurality of photovoltaic cells 4 is distant by a distance $D_A$ from one edge 1A of the photovoltaic module 1.

The photovoltaic module 1 also comprises a third layer 15, or strengthening layer, located below the plurality of photovoltaic cells 4 and above the lower encapsulating layer 3b. This third layer forms a peripheral strip 15A that extends from the edge 1A and projects under the photovoltaic cell 41 (or photovoltaic cells) closest to the edge 1A. The width $L_{15A}$ of this peripheral strip is thus larger than the distance $D_A$.

By way of example, the distance $D_A$ may be equal to 50 mm and the width Lisa of the peripheral strip 15A equal to 70 mm. More generally, the difference between the width $L_{15A}$ and the distance $D_A$ is smaller than or equal to 30 mm, preferably smaller than or equal to 20 mm, and even more preferably comprised between 10 and 20 mm.

FIG. 4 corresponds to a view from above of an example of realization of the embodiment of FIG. 3.

It may be seen that the photovoltaic cells are distant from all the edges 1A, 1B, 1C, 1D of the photovoltaic module 1 by a distance $D_A$, $D_B$, $D_C$, $D_D$. Four photovoltaic cells 41, 42, 43, 44 have been shown, but this number is non-limiting, and there could be more, or fewer, thereof.

Thus, the third layer 15 forms four peripheral strips 15A, 15B, 15C, 15D, one per edge 1A, 1B, 1C, 1D, thus forming a frame. Each peripheral strip extends from one edge and projects under the two photovoltaic cells closest to the edge. The width $L_{15A}$ ($L_{15B}$, $L_{15C}$, $L_{15D}$, respectively) of each peripheral strip is larger than the distance $D_A$ ($D_B$, $D_C$, $D_D$, respectively) between the edge parallel to said strip and the plurality of photovoltaic cells (4).

In the embodiment illustrated in a simplified manner in FIG. 4, all the distances are substantially equivalent, as are the widths of the strips, though this is not always the case.

By way of example, the distances $D_A$, $D_B$, $D_C$, $D_D$ may be equal to 50 mm and the widths $L_{15A}$, $L_{15B}$, $L_{15C}$, $L_{15D}$ of the peripheral strips 15A, 15B, 15C, 15D equal to 70 mm.

More generally, the difference between the width $L_{15A}$ ($L_{15B}$, $L_{15C}$, $L_{15D}$, respectively) of the strip of the third layer 15 and the distance $D_A$ ($D_B$, $D_C$, $D_D$, respectively) between the edge parallel to said strip and the cells is smaller than or equal to 30 mm, preferably smaller than or equal to 20 mm, and even more preferably comprised between 10 and 20 mm.

In contrast, the lengths of the peripheral strips are not necessarily equal in order to cover all of the edges without indenting being required, and thus form a frame (otherwise it is possible to envisage each peripheral strip being the shape of an isosceles trapezium of 45° angle). Alternatively, the frame may be one piece.

Figure 5:
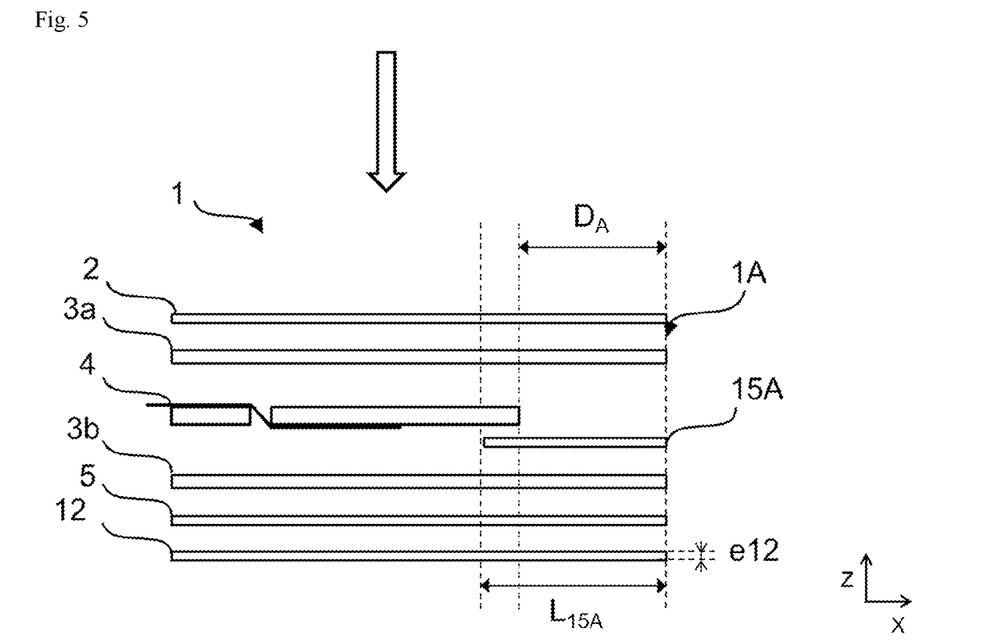
FIG. 5 illustrates, in cross section and exploded, one variant of the first embodiment of a photovoltaic module according to the invention.

FIG. 5 illustrates, in cross section and exploded, one variant of the first embodiment.

The photovoltaic module of FIG. 5 may comprise all or some of the features described above, and in particular the features described with reference to FIGS. 3 to 4 which will therefore not be described again. However, in this variant, the photovoltaic module 1 comprises a fourth layer 12 forming the back side of the photovoltaic module 1, the second layer 5 being located between the fourth layer 12 and the encapsulating assembly 3.

This fourth layer 12 is made of the same material as the material from which the first layer 2 forming the front side of the photovoltaic module 1 is made. Advantageously, this material corresponds to ethylene chlorotrifluoroethylene (ECTFE), which is also known by the name Halar®.

Moreover, the fourth layer 12 has a thickness e12 smaller than, or equal in this variant of FIG. 5, to the thickness e2 of the first layer 2.

The fourth layer 12 advantageously allows the module 1 to be insulated dielectrically and chemically.

Figure 6:
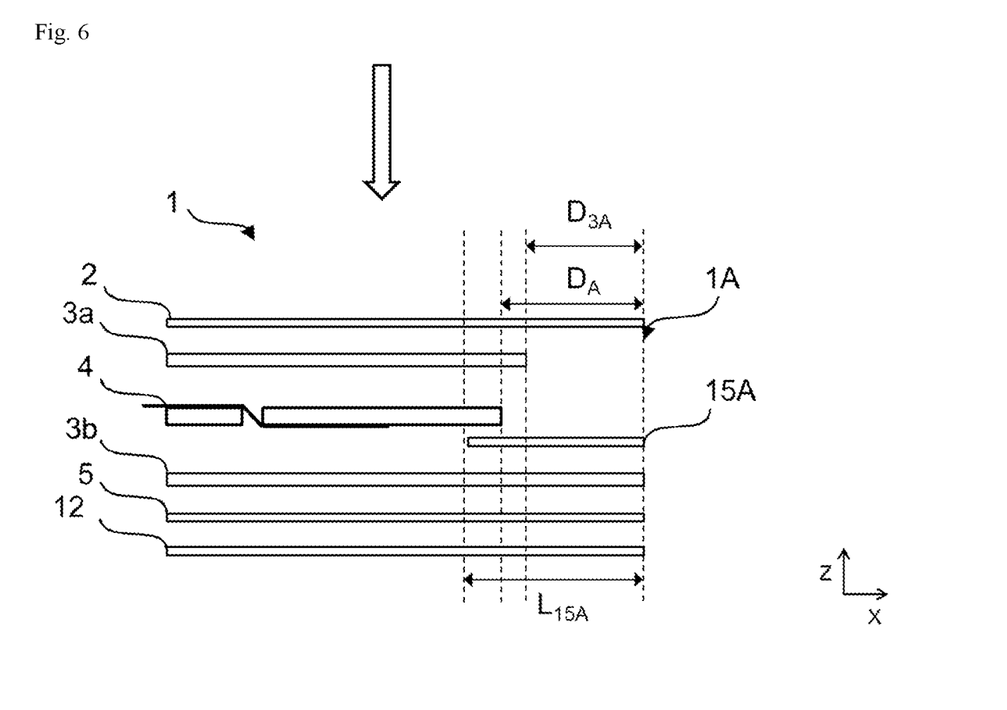
FIG. 6 illustrates, in cross section and exploded, a second embodiment of a photovoltaic module according to the invention.
Figure 7:
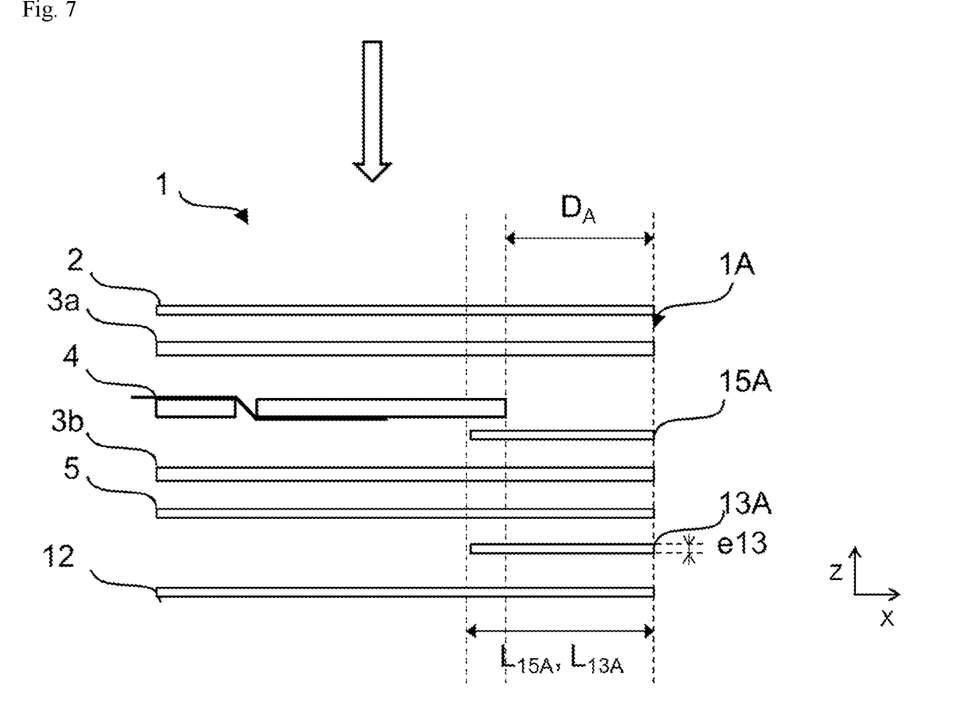
FIG. 7 illustrates, in cross section and exploded, a third variant of a photovoltaic module according to the invention.

The fourth layer 12 forming the back side is also shown in FIGS. 6 and 7. However, it could be omitted.

FIG. 6 illustrates, in cross section and exploded, a second embodiment of a photovoltaic module.

The photovoltaic module of FIG. 6 may comprise all or some of the features described above, and in particular the features described with reference to FIGS. 3 to 5 which will therefore not be described again.

However, in this second embodiment, the upper encapsulating layer (3a) is distant by a distance $D_3$ from the edge 1A of the photovoltaic module. This distance $D_3$ is smaller than the distance $D_A$ and hence the upper encapsulating layer (3a) is still able to protect the photovoltaic cells.

The upper encapsulating layer (3a) may be distant from all the edges of the photovoltaic module, and may in particular be distant by the same distance $D_3$ from all the edges of the photovoltaic module, as for example in a configuration of the type in FIGS. 4 and 8.

By way of example, the distance $D_A$ may be equal to 50 mm, the width $L_{15A}$ of the peripheral strip 15A equal to 70 mm and the distance $D_3$ equal to 30 mm.

More generally, the difference between the width $L_{15A}$ ($L_{15B}$, $L_{15C}$, $L_{15D}$, respectively) and the distance $D_A$ ($D_B$, $D_C$, $D_D$, respectively) is smaller than or equal to 30 mm, preferably smaller than or equal to 20 mm, and even more preferably comprised between 10 and 20 mm, and the difference between $D_A$ ($D_B$, $D_C$, $D_D$, respectively) and $D_3$ is smaller than or equal to 10 mm.

FIG. 7 illustrates, in cross section and exploded, a third embodiment of a photovoltaic module.

The photovoltaic module of FIG. 7 may comprise all or some of the features described above, and in particular the features described with reference to FIGS. 3 to 5 which will therefore not be described again. However, in this third embodiment, the photovoltaic module comprises a fifth layer 13 located below the second layer 5 and above the fourth layer 12.

This fifth layer forms at least one peripheral strip 13A extending from one edge 1A and projects below the photovoltaic cell 41 (or photovoltaic cells) closest to the edge 1A. The width $L_{13A}$ of this peripheral strip is larger than the distance $D_1$.

This fifth layer 13 is preferably made of the same material as the encapsulating assembly 3. Alternatively, the fifth layer is made of a material different from the material of the encapsulating assembly but it must have at least the same thermomechanical properties.

The advantage of this fifth layer is to make the edge and/or edges symmetric.

By way of example, the distance $D_A$ may be equal to 50 mm, the width $L_{15A}$ of the peripheral strip 15A equal to 70 mm and the width $L_{13A}$ of the peripheral strip 13A equal to 70 mm.

More generally, the difference between the width $L_{13A}$ and the distance $D_A$ is smaller than or equal to 30 mm, preferably smaller than or equal to 20 mm and even more preferably comprised between 10 and 20 mm.

Preferably, the width $L_{13A}$ is equal to the width $L_{15A}$.

FIG. 8 corresponds to a view from above of one particular example of realization of the third embodiment, in which view only the (bottom) fourth layer 12, the fifth layer 13 and four photovoltaic cells 41, 42, 43, 44 have been shown (the layers 5, 3b, 15 that are between the layer 13 and the cells have not been shown, although present, for the sake of legibility of the figures, and likewise as regards the layers above the cells).

It may be seen that the photovoltaic cells are distant from all the edges 1A, 1B, 1C, 1D of the photovoltaic module 1 by a distance $D_A$, $D_B$, $D_C$, $D_D$. Four cells have been shown but this number is non-limiting, and there could be more, or fewer, thereof.

The fifth layer 13 may thus form four peripheral strips, one per edge, as for example shown in the configuration of FIG. 8, thus also forming a frame. The frame may be one piece.

In the embodiment illustrated in a simplified manner in FIG. 8, all the distances are substantially equivalent, as are the widths of the strips, though this is not always the case.

By way of example, the distances $D_A$, $D_B$, $D_C$, $D_D$ may be equal to 50 mm, and the widths $L_{13A}$, $L_{13B}$, $L_{13C}$, $L_{13D}$ of the peripheral strips 13A, 13B, 13C, 13D equal to 70 mm.

More generally, the difference between the strip width $L_{13A}$ ($L_{13B}$, $L_{13C}$, $L_{13D}$, respectively) of the fifth layer and the distance $D_A$ ($D_B$, $D_C$, $D_D$, respectively) is smaller than or equal to 30 mm, preferably smaller than or equal to 20 mm, and even more preferably comprised between 10 and 20 mm.

Preferably, the strip width $L_{13A}$ ($L_{13B}$, $L_{13C}$, $L_{13D}$, respectively) of the fifth layer 13 is equal to the strip width $L_{15A}$ ($L_{15B}$, $L_{15C}$, $L_{15D}$, respectively) of the third layer 15.

The fifth layer 13 is preferably of the same geometric shape as the third layer 15, so that they may superpose.

The fifth layer 13 may in particular have a thickness e13 smaller than or equal to 150 μm, or even smaller than or equal to 100 μm.

By way of example, and for all or each of the embodiments presented above:

the material of the second layer 5, and the material of the third layer 15, may be a film of a pre-preg composite composed of glass cloth impregnated with an epoxy resin such as Hexply M77 from the company Hexcel;
the first layer 2 forming the front side may be a film of the ethylene chlorotrifluoroethylene (ECTFE) (known by the name Halar) ECT 020 from the company Rayotec, of thickness of the order of 20 μm;
the encapsulating layers 3a and 3b may be ionomer films obtained from the Jurasol™ range sold by the company Juraplast, of thickness of the order of 50 μm; and likewise for the fifth layer 13 when it is included;
the photovoltaic cells 4 may be heterojunction cells based on single-crystal and amorphous silicon of thickness of the order of 115 μm, or IBC cells of thickness of the order of 160 μm.

A photovoltaic module 1 is produced in a single step of hot lamination, at a temperature comprised between 130° C. and 170° C., and in particular of the order of 150° C., the lamination cycle lasting at least 10 minutes, and in particular between 10 and 20 minutes, of the constituent layers from which the photovoltaic module 1 is made.

The various presented embodiments may be combined together.

Furthermore, the present invention is not limited to the embodiments described above but encompasses any embodiment falling within the scope of the claims.

The invention claimed is:

1. A photovoltaic module comprising:
a transparent first layer forming the front side of the photovoltaic module, which side is intended to receive a light flux,
a plurality of photovoltaic cells placed side-by-side and electrically connected to one another,
an encapsulating assembly able to encapsulate the plurality of photovoltaic cells, and comprising a lower portion and an upper portion, the encapsulating assembly preferably being made of polymer,
a second layer comprising at least one composite material based on polymer resin and on fibres,
the encapsulating assembly and the plurality of photovoltaic cells being located between the first and second layers,
at least the first layer and the second layer defining the edges of the photovoltaic module;
wherein the plurality of photovoltaic cells is spaced apart by a non-zero distance $D_A$ from at least one edge of the photovoltaic module, and in that the photovoltaic module further comprises a third layer, or strengthening layer, located below the plurality of photovoltaic cells and above the lower portion of the encapsulating assembly, said third layer forming at least one peripheral strip extending from the at least one edge toward the centre of said module and the width ($L_{15A}$) of which is larger than or equal to the distance $D_A$, said third layer comprising at least one composite material based on polymer resin and on fibres.

2. The photovoltaic module according to claim 1, the difference between the width ($L_{15A}$) of the at least one peripheral strip and the distance $D_A$ between the plurality of photovoltaic cells and the at least one edge being smaller than or equal to 30 mm, and preferably smaller than or equal to 20 mm.

3. The photovoltaic module according to claim 1, the third layer and/or the second layer being made of a composite material based on polymer and on fibres,
the polymer preferably being chosen from polyester, epoxy and/or acrylic; and/or
the fibres preferably being chosen from glass fibres, carbon fibres and/or aramid fibres.

4. The photovoltaic module according to claim 1, the third layer being made of the same composite material as the second layer.

5. The photovoltaic module according to claim 1, the third layer forming a plurality of peripheral strips, and preferably at least two opposite strips, and even more preferably four strips, each peripheral strip extending from one edge of the photovoltaic module toward the centre of said module, the width ($L_{15A}$, $L_{15B}$, $L_{15C}$, $L_{15D}$) of each peripheral strip being larger than or equal to the distance $D_A$, $D_B$, $D_C$, $D_D$ between said edge and the plurality of photovoltaic cells, the difference between the width of each peripheral strip and the distance $D_A$, $D_B$, $D_C$, $D_D$ preferably being smaller than or equal to 30 mm, and even more preferably smaller than or equal to 20 mm.

6. The photovoltaic module according to claim 1, the encapsulating assembly extending up to the edges of the photovoltaic module.

7. The photovoltaic module according to claim 1, the upper portion of the encapsulating assembly being spaced apart by a distance $D_{3A}$ from at least one edge of the photovoltaic module, the distance $D_{3A}$ being non-zero and smaller than the distance $D_A$ between said at least one edge and the plurality of photovoltaic cells, the difference between said distances $D_A$ and $D_{3A}$ preferably being smaller than or equal to 10 mm.

8. The photovoltaic module according to claim 1, further comprising a fifth layer, which is preferably made of polymer, located below the second layer, said fifth layer forming at least one peripheral strip extending from the at least one edge toward the centre of said module and the width ($L_{13A}$) of which is larger than or equal to the distance $D_A$ between said at least one edge and the plurality of photovoltaic cells, the difference between said width and said distance preferably being smaller than or equal to 30 mm, and even more preferably smaller than or equal to 20 mm.

9. The photovoltaic module according to claim 8, the fifth layer forming a plurality of peripheral strips, and preferably at least two opposite strips, and even more preferably four strips, each peripheral strip extending from one edge of the photovoltaic module toward the centre of said module and the width ($L_{13A}$, $L_{13B}$, $L_{13C}$, $L_{13D}$) of each peripheral strip being larger than or equal to the distance $D_A$, $D_B$, $D_C$, $D_D$ between said edge and the plurality of photovoltaic cells, the difference between said width and said distance preferably being smaller than or equal to 30 mm, and even more preferably smaller than or equal to 20 mm.

10. The photovoltaic module according to claim 8, the fifth layer being made of a material having the same thermomechanical characteristics as the material of the encapsulating assembly, and preferably of the same material as the encapsulating assembly.

11. The photovoltaic module according to claim 8, the dimensions of the fifth layer being substantially equal to the dimensions of the third layer.

12. The photovoltaic module according to claim 1, further comprising:
a fourth layer forming the back side of the photovoltaic module, the second layer being located between the encapsulating assembly and the fourth layer, said fourth layer being made of the same material as the material from which the first layer is made, and having a thickness smaller than or equal to that of the first layer.

13. The photovoltaic module according to claim 1, the first layer being made of a polymer.

14. The photovoltaic module according to claim 1, the first layer having a thickness smaller than or equal to 50 μm.

15. The photovoltaic module according to claim 1, the encapsulating assembly having a maximum thickness smaller than 150 μm.

16. The photovoltaic module according to claim 1, the second layer having a weight per unit area lower than 150 g/m².

17. The photovoltaic module according to claim 1, the encapsulating assembly comprising an upper encapsulating layer placed between the first layer and the plurality of photovoltaic cells and a lower encapsulating layer placed between the plurality of photovoltaic cells and the second layer.

18. A process for producing a chosen photovoltaic module according to claim 1, further comprising a step of hot lamination, at a temperature comprised between 130° C. and 170° C., and in particular of the order of 150° C., the lamination cycle lasting at least 10 minutes, and in particular between 10 and 20 minutes, of the layers from which the photovoltaic module is made.

* * * * *